(12) United States Patent
Kim (10) Patent No.: US 7,148,108 B2
(45) Date of Patent: Dec. 12, 2006

(54) METHOD OF MANUFACTURING SEMICONDUCTOR DEVICE HAVING STEP GATE

(75) Inventor: Tae Kyun Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 42 days.

(21) Appl. No.: 11/159,021

(22) Filed: Jun. 22, 2005

(65) Prior Publication Data
US 2006/0211213 A1    Sep. 21, 2006

(30) Foreign Application Priority Data
Mar. 15, 2005    (KR) ...................... 10-2005-0021392

(51) Int. Cl.
*H01L 21/336*    (2006.01)
*H01L 21/3205*    (2006.01)

(52) U.S. Cl. ...................... 438/259; 438/589; 438/595; 257/E21.438; 257/E21.507; 257/E21.262

(58) Field of Classification Search ................ 438/259, 438/589, 595; 257/E21.438, E21.507, E21.626
See application file for complete search history.

(56) References Cited

U.S. PATENT DOCUMENTS 5,254,495 A  * 10/1993  Lur et al. .................... 438/447
5,776,817 A  *  7/1998  Liang ......................... 438/427
6,451,693 B1 *  9/2002  Woo et al. ................... 438/682

* cited by examiner

*Primary Examiner*—Michael Lebentritt
*Assistant Examiner*—Ron Pompey
(74) *Attorney, Agent, or Firm*—Ladas & Parry LLP

(57) ABSTRACT

Disclosed herein is a method of manufacturing a semiconductor device having a step gate, which can improve the refresh characteristics of the device. The method comprises the steps of: forming on a silicon substrate having active and field regions a first hard mask exposing the field region; etching the exposed field region to form a trench; forming an isolation film by filling an insulating film in the trench; forming a second hard mask exposing both sides of the active region by etching the first hard mask; forming a metal film on the resulting substrate including the second hard mask; forming a metal silicide film on both sides of the active region by annealing the resulting substrate; removing the metal film unreacted in the annealing step and the metal silicide film, thereby recessing both sides of the active region; removing the second hard mask; and forming a step gate on both edges of the central portion of the active region and the recessed portion of the active region, adjacent to each of the edges.

13 Claims, 7 Drawing Sheets

FIG.1A
(PRIOR ART)

FIELD REGION | ACTIVE REGION | FIELD REGION

FIG.1B
(PRIOR ART)

FIELD REGION | ACTIVE REGION | FIELD REGION

FIELD REGION | ACTIVE REGION | FIELD REGION

FIG.1G
(PRIOR ART)

FIELD REGION | ACTIVE REGION | FIELD REGION

FIG.2A

FIELD REGION   ACTIVE REGION   FIELD REGION

FIG.2B

FIELD REGION   ACTIVE REGION   FIELD REGION

FIG.2C

FIELD REGION    ACTIVE REGION    FIELD REGION

FIG.2D

FIELD REGION    ACTIVE REGION    FIELD REGION

FIELD REGION | ACTIVE REGION | FIELD REGION

FIG.2H

FIELD REGION | ACTIVE REGION | FIELD REGION

METHOD OF MANUFACTURING SEMICONDUCTOR DEVICE HAVING STEP GATE

BACKGROUND OF THE INVENTION

1. Field of the Invention

The present invention relates to a method of manufacturing a semiconductor device, and more particularly, to a method of manufacturing a semiconductor device having a step gate, which can improve the refresh characteristics of the device.

2. Description of the Prior Art

Currently, as the size of a semiconductor device becomes smaller, it is more and more difficult to secure the capacity of a capacitor. Also, as the magnitude of electric field in the junction regions of a transistor becomes larger, it is more and more difficult to secure the refresh characteristics of a cell area. For this reason, a method is used which makes the effective channel length of a transistor long by the use of a three-dimensional cell other than the existing planar cell.

Particularly, a step gate structure was recently proposed which is formed by recessing a portion of both sides of the active region of a substrate and then forming a step gate over the non-recessed edge portion of the active region and the recessed portion of the active region. In this structure, the effective channel length required for the operation of the gate is increased, resulting in an increase in the threshold voltage, leading to an improvement in the refresh characteristics.

FIGS. 1A to 1G are cross-sectional views for explaining each step of a method of manufacturing a semiconductor device having a step gate.

Figure 1A:
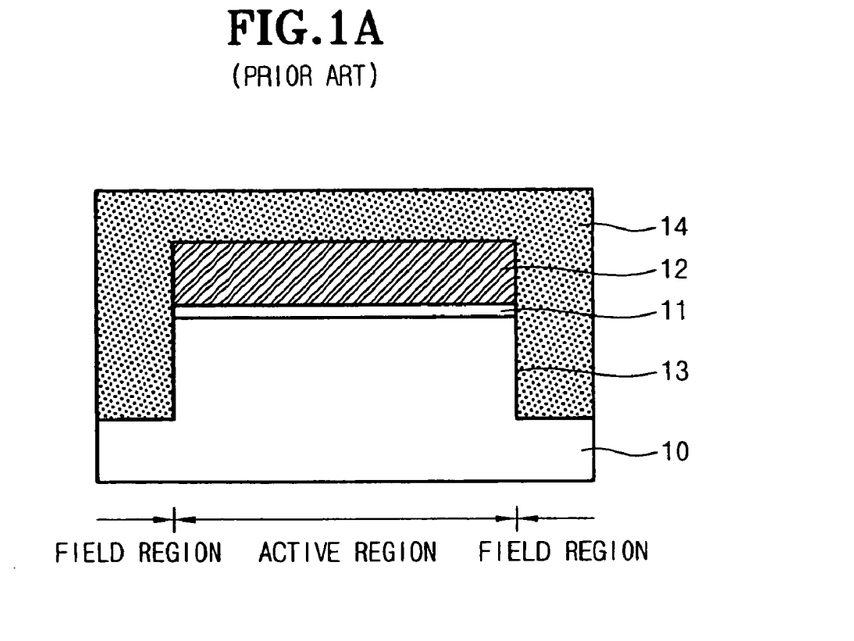
FIGS. 1A to 1G are cross-sectional views for explaining each step of a method of manufacturing a semiconductor device having a step gate according to the prior art.

As shown in FIG. 1A, the pad oxide film 11 and the pad nitride film 12 are sequentially deposited on the substrate 10 having an active region and a field region. Then, the pad nitride film 12 is etched so as to expose the field region, and pad oxide film 11 and the silicon substrate 10 are etched using the remaining pad nitride film 12 as an etch barrier, thereby forming the trench 13 in the field region. Then, on the resulting substrate, the gap-fill oxide 14 is formed so as to fill the trench 13.

Figure 1B:
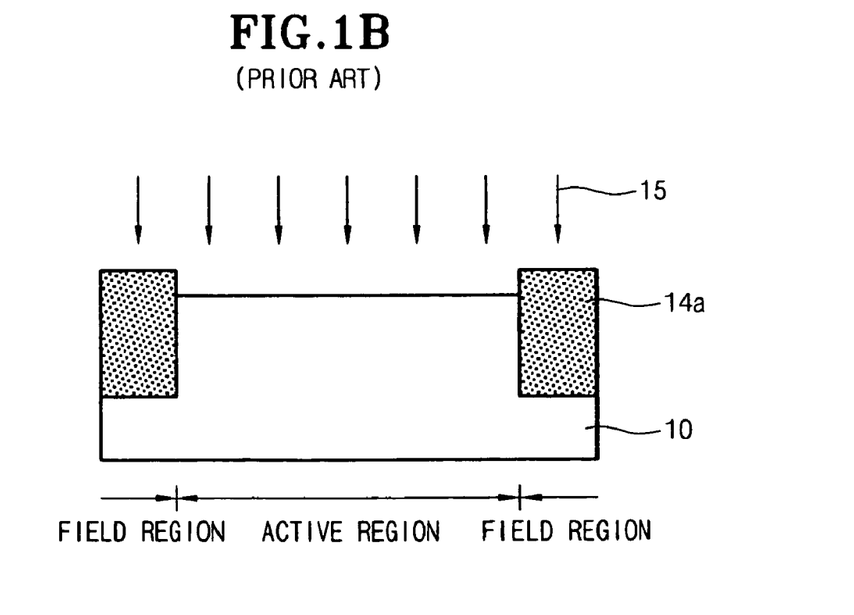

As shown in FIG. 1B, the gap-fill oxide film is then subjected to chemical mechanical polishing (hereinafter, also referred to as "CMP") until the pad nitride film is exposed. Next, the remaining pad nitride film is removed to form an isolation film 14a on the field region of the substrate. Then, the cleaning process 15 is performed so as to in order to remove a native oxide film (not shown) present on the substrate 10.

Figure 1C:
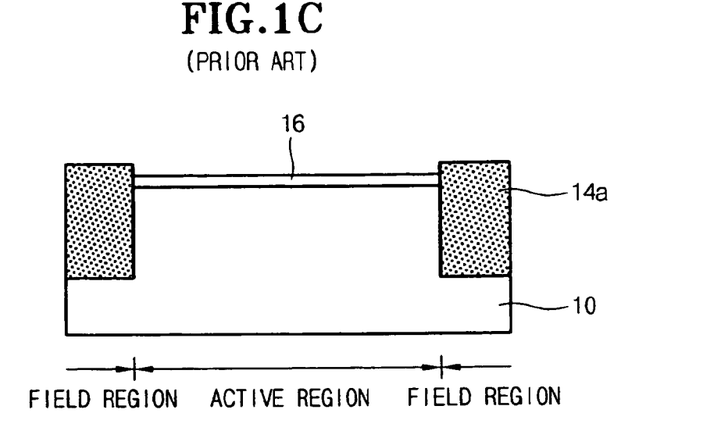

As shown in FIG. 1C, the hard mask oxide film 16 is then formed on the active region of the substrate 10.

Figure 1D:
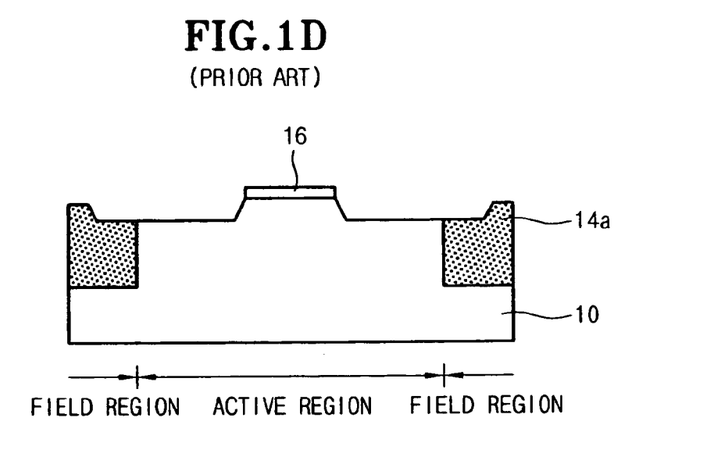

As shown in FIG. 1D, the hard mask oxide film 16 is then etched so as to expose both sides of the active region. Then, exposed portion of both sides of the active region is etched using the remaining hard mask oxide film 16, thereby recessing the active regions. At this time, a portion of the isolation film, adjacent to the edge of the active region, is also recessed. The recessed portion of the substrate 10 will be contacted with a capacitor to be formed later.

Figure 1E:
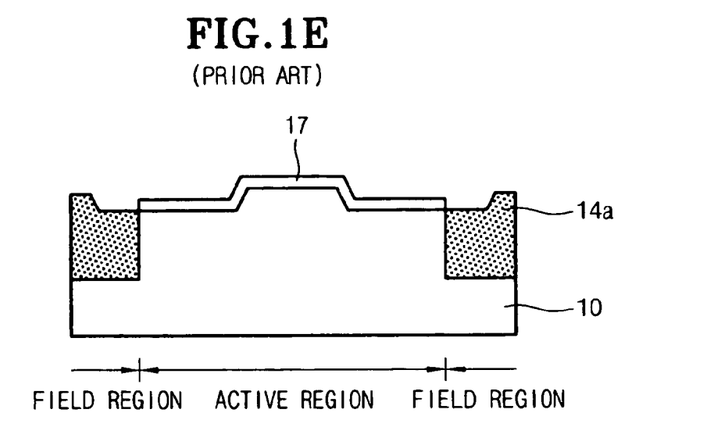

As shown in FIG. 1E, the remaining hard mask oxide film 16a is then removed. Next, on the active region of the substrate 10, the screen oxide film 17 is formed. Then, although not shown in the drawings, a well ion implantation process and a channel ion implantation process are sequentially performed.

Figure 1F:
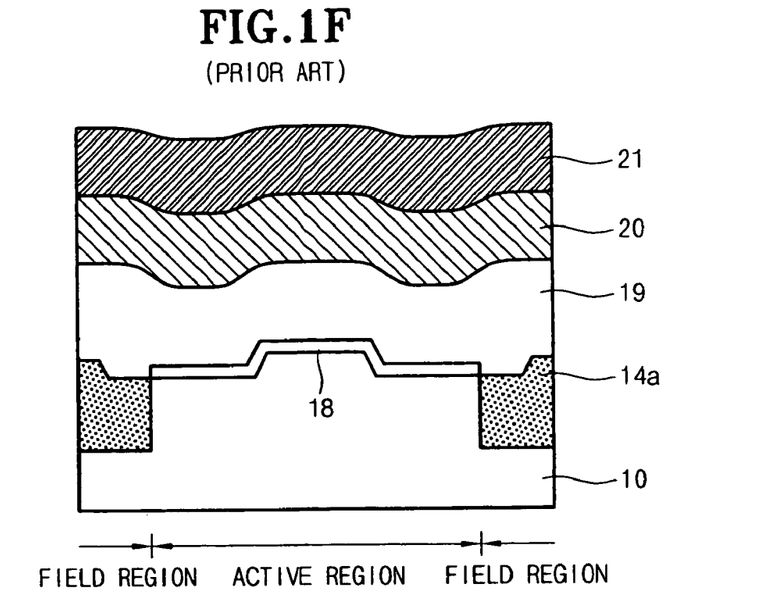

As shown in FIG. 1F, the screen oxide film is then removed. Following this, the gate oxide film 18 is then formed on the surface of the active region of the substrate 10. Next, the doped polycrystalline silicon film 19, the tungsten silicide film 20 and the gate hard mask film 21 are sequentially formed on the entire surface of the substrate 10 including the gate oxide film 18.

Figure 1G:
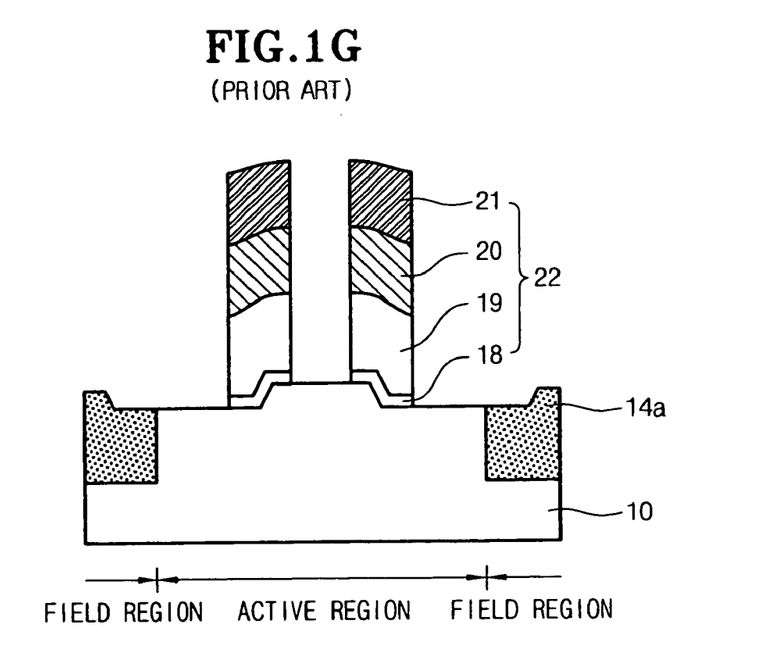

As shown in FIG. 1G, the gate hard mask film 21 is then etched in a gate pattern shape. Next, the tungsten silicide film 20, the doped polycrystalline silicon film 19 and the gate oxide film 18 are etched by using the remaining gate hard mask film 21 as an etch barrier, thereby forming a step gate on each of both edges of the central portion of the active region and the recessed portion of the active region, adjacent to each of the edges.

However, in the method of manufacturing the semiconductor device according to the prior art, the step of forming the hard mask oxide film 16 is additionally performed as compared to the existing method of forming a planar cell. This additional step makes the process complex and results in an increase in manufacturing costs.

Also, in the cleaning process conducted to remove the native oxide before the formation of the hard mask oxide film 16, the isolation film 14a will be attacked by etchants, thus causing variations in the channel profile of the isolation film, such as an increase in moat depth and a reduction in effective fox height (FOX). This will result in rapid deterioration in the refresh characteristics of the device.

Furthermore, as the etching process of recessing both sides of the active region of the substrate 10 is progressed, a portion of the edge of the active region of the substrate 10, adjacent to the isolation film 14a, will have a sharp profile. For this reason, when supply voltage (Vcc) required for the operation of the device is applied to the gate 22, an electric field intensive effect will occur which increases the magnitude of electric field at a portion of the substrate having the sharp profile. Thus, the leakage current of the device will be increased, resulting in deterioration in the gate oxide integrity of the device. Also, in the etching process for recessing the active region of the substrate 10, not only the surface of the silicon substrate 10 will be damaged but also the recessed depth of the substrate 10 will become non-uniform, resulting in variations in the channel profile of the device. As a result, the refresh characteristics of the device will be deteriorated.

SUMMARY OF THE INVENTION

Accordingly, the present invention has been made to solve the above-mentioned problems occurring in the method of manufacturing the semiconductor device according to the prior art, and it is an object of the present invention to provide a method of manufacturing a semiconductor device having, which can make a manufacturing process simple and improve the refresh characteristics of the device.

To achieve the above object, the present invention provides a method of manufacturing a semiconductor device, the method comprising the steps of: forming on a silicon substrate having active and field regions a first hard mask exposing the field region; etching the exposed field region to form a trench; forming an isolation film by filling an insulating film in the trench; forming a second hard mask exposing both sides of the active region by etching the first hard mask; forming a metal film on the resulting substrate including the second hard mask; forming a metal silicide film on both sides of the active region by annealing the resulting substrate; removing the metal film unreacted in the annealing step and the metal silicide film, thereby recessing both sides of the active region; removing the second hard mask; and forming a step gate on both edges of the central portion of the active region and the recessed portion of the active region, adjacent to each of the edges.

In the inventive method, each of the first and second hard masks preferably consists of an oxide film and a nitride film deposited on the oxide film.

Also, the trench is preferably formed to a depth of 2,000–3,000 Å.

Also, the metal film is preferably formed by a PVD or CVD process to a thickness of 100–500 Å.

Also, the metal film is preferably made of any one selected from Ti, W, Ni, Co, Ta and Mo.

Also, the annealing is preferably performed at a temperature of 600–800° C. for 10–60 seconds under an atmosphere of $N_2$.

Also, the metal silicide film is preferably formed to a thickness of 200–1,000 Å.

Also, the removal of the unreacted metal film is preferably performed with a mixed solution of $H_2SO_4$ and $H_2O_2$ at a temperature of 100–130° C., in which the mixing ratio between $H_2SO_4$ and $H_2O_2$ in the mixed solution is 3:1 to 4:1.

Alternatively, the removal of the unreacted metal film is preferably performed with a mixed solution of $NH_4OH$, $H_2O_2$ and $H_2O$ at a temperature of ambient temperature to 40° C., in which the mixing ratio between $NH_4OH$, $H_2O_2$ and $H_2O$ in the mixed solution is 1:1:5.

Also, the removal of the metal silicide film is preferably performed with a mixed solution of $H_2O$ and HF at a temperature of 4–60° C., in which the mixing ratio between $H_2O$ and HF in the mixed solution is 50:1 to 100:1.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

FIGS. 2A to 2H are cross-sectional views for explaining each step of a method of manufacturing a semiconductor device having a step gate according to the present invention.

Figure 2A:
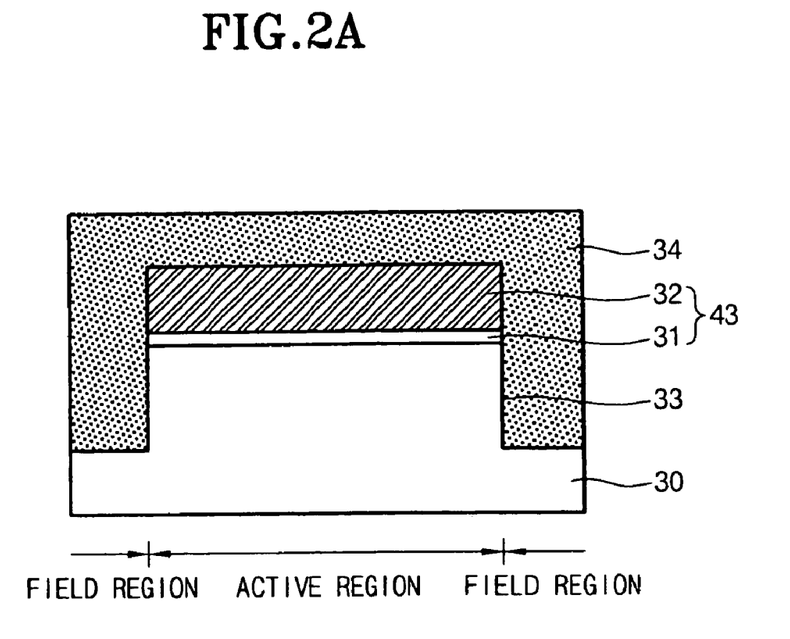
FIGS. 2A to 2H are cross-sectional views for explaining each step of a method of manufacturing a semiconductor device having a step gate according to the present invention.

As shown in FIG. 2A, the pad oxide film 31 and the pad nitride film 32 are sequentially deposited on the substrate 30 having an active region and a field region. Then the pad nitride film 32 and the pad oxide film 21 are etched, thereby forming the first hard mask 43 exposing the field region. The pad oxide film 31 is formed to a thickness of 50–150 Å, and the pad nitride film 32 is formed to a thickness of 500–1,000 Å. Thereafter, the portion of the exposed field region of the silicon substrate 30 is etched using the first hard mask 43 as an etch barrier, so that the trench 33 is formed. The depth of the trench 33 is 2,000–3,000 Å. Then, on the resulting structure, an insulating film, i.e., the gap-fill oxide film 34 is formed to fill the trench 33.

Figure 2B:
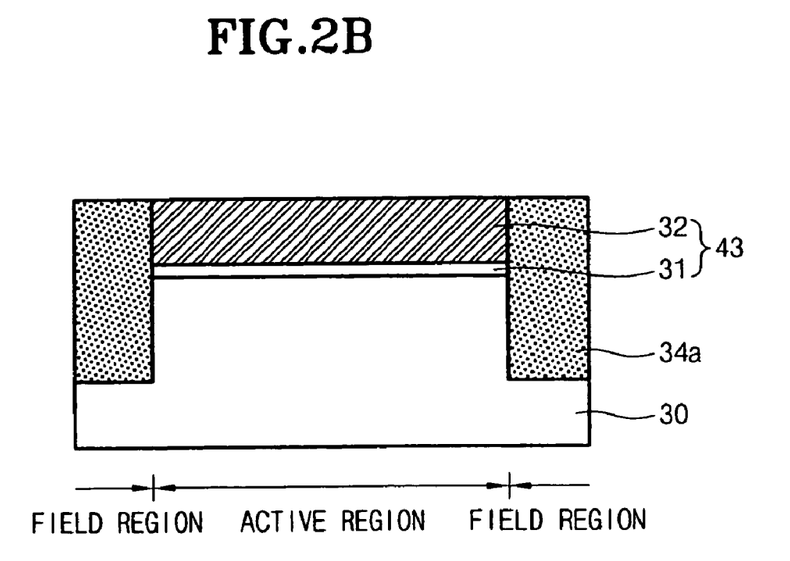

As shown in FIG. 2B, the gap-fill oxide film 34 is then subjected to CMP until the first hard mask 43 is exposed, thereby forming the isolation film 34a.

Figure 2C:
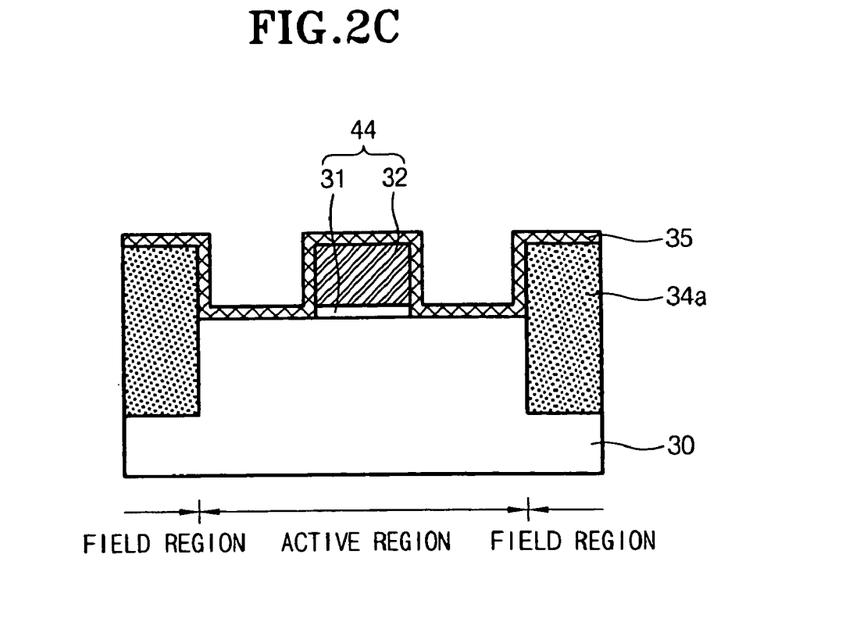

As shown in FIG. 2C, the first hard pattern 43 is selectively etched, so that the second hard mask 44 exposing both sides of the active region is formed. Thereafter, the transition metal film 35 made of, for example, Ti, is formed on the entire surface of the resulting substrate. The transition metal film 35 is formed by physical vapor deposition (PVD) or chemical vapor deposition (CVD) process to a thickness of 100–500 Å. The transition metal film 35 is made of any one selected from the group consisting of Ti, W, Ni, Co, Ta and Mo.

Figure 2D:
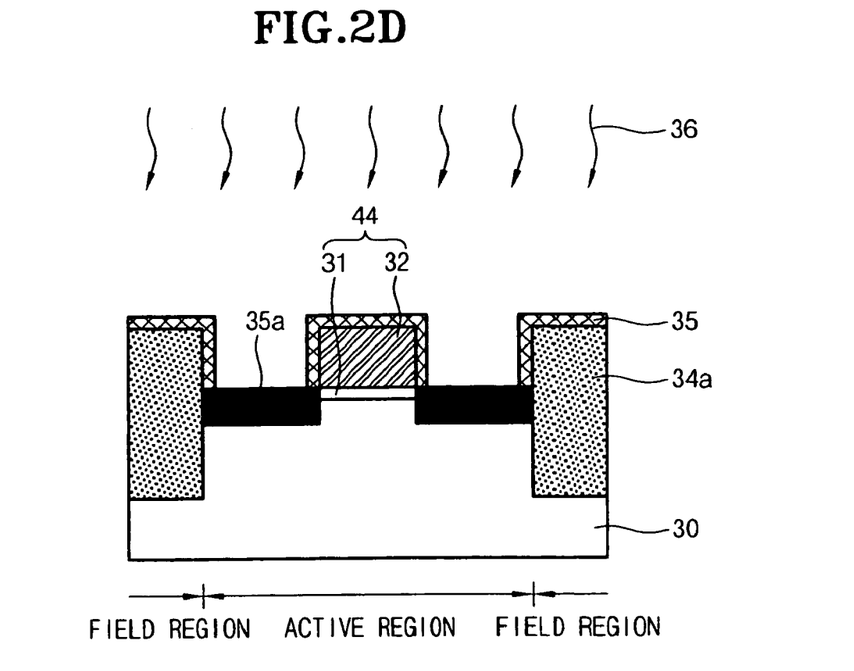

As shown in FIG. 2D, the substrate 30 having the transition metal film 35 formed thereon is then subjected to the annealing process 36 such as a rapid thermal process, so that the metal-silicide film 35a on both sides of the active region, which have not been covered with the second hard mask 44, is formed. The annealing process 36 is performed at a temperature of 600–800° C. for 10–60 seconds under an atmosphere of $N_2$. The metal silicide film 35a is formed to a thickness of 200–1,000 Å.

Figure 2E:
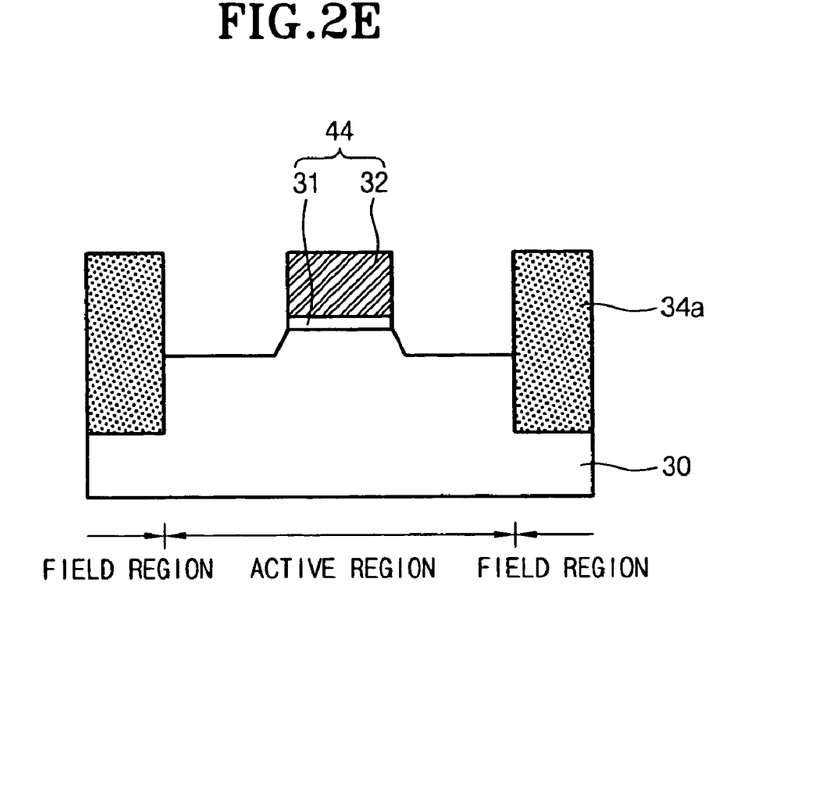

As shown in FIG. 2E, the transition metal film 35 unreacted in the annealing process 36 is removed. The process of removing the unreacted transition metal film 35 is performed with a solution of $H_2SO_4$ and $H_2O_2$ (mixing ratio=3:1–4:1) at a temperature of 100–130° C. or performed with a solution of $NH_4OH$, $H_2O_2$ and $H_2O$ (mixing ratio=1:1:5) at a temperature of ambient temperature to 40° C.

Thereafter, the metal silicide film is removed by wet etching, so that the both sides of the active region is recessed. The recessed portion of the substrate 30 will be contacted with a capacitor to be formed later. The process of removing the metal silicide film is performed with a solution of $H_2O$ and HF (mixing ratio=100:1) at a temperature of 4–60° C. Meanwhile, since the thickness of the metal silicide film removed as described above is 200–1,000 Å, the recessed depth of the substrate 30 is likewise about 200–1,000 Å.

By recessing both sides of the active region by the application of the processes for the selective formation and removal of the metal silicide layer 35a as described above, the process of forming the hard mask oxide film used to recess the substrate 30 in the prior art may be omitted. Due to the omission of the process of forming the hard mask oxide film, a cleaning process conducted to remove a native oxide film before the hard mask oxide film-forming process may be omitted, and thus, there is no worry that the isolation film 34a will be attacked by etchant. Thus, variations in the profile of the isolation film 34a, such as an increase in moat depth and a reduction in EFH, will not occur, so that the refresh characteristics of the device will not be rapidly deteriorated.

Also, since the recessing of both sides of the active region on the substrate 30 is recessed made by the processes for selectively forming and removing the metal silicide film, damage to the surface of the silicon substrate 30 can be prevented, and the non-uniformity of the recessed depth of the substrate 30 can be minimized. This can prevent variations in the channel profile, thus improving the refresh characteristics of the device.

Figure 2F:
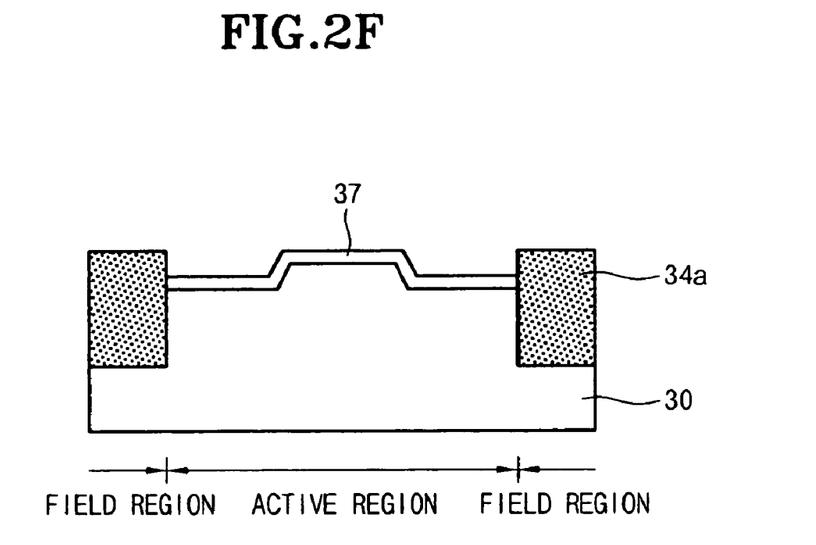

Thereafter, as shown in FIG. 2F, the remaining second hard mask is removed. Then, the screen oxide film 37 is formed on the active region of the substrate 30. Then, although not shown in the drawings, a well ion implantation process and a channel ion implantation process are sequentially performed.

Figure 2G:
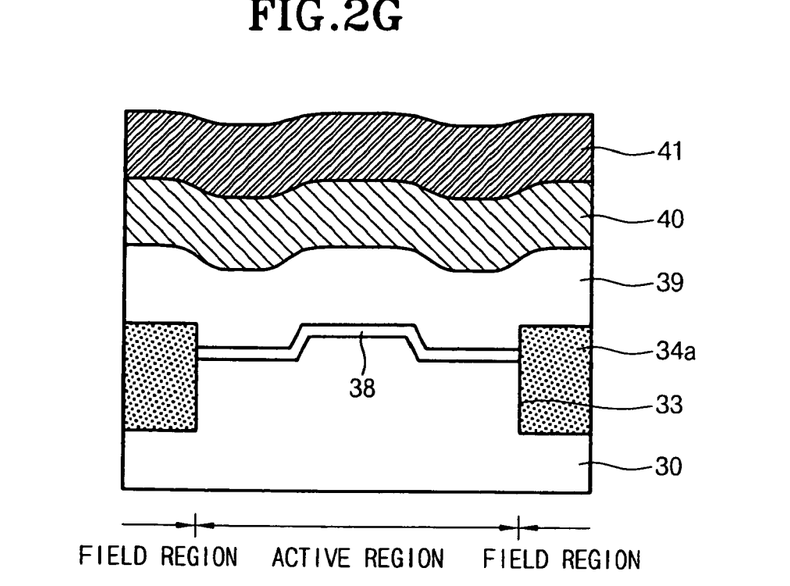

Thereafter, as shown in FIG. 2G, the screen oxide film is removed. Then, the gate oxide film 38 is formed on the surface of the active region of the substrate 30. The gate oxide film 38 is formed to a thickness of 30–50 Å. Then, the doped polycrystalline silicon film 39, the tungsten silicide film 40 and the gate hard mask film 41 are sequentially formed on the entire surface of the substrate including the gate oxide film 38. The doped polycrystalline silicon film 39 is formed to a thickness of 400–700 Å, the tungsten silicide film 40 is formed to a thickness of 1,000–1,500 Å, and the gate hard mask film 41 is formed to a thickness of 2,000–2,500 Å.

Figure 2H:
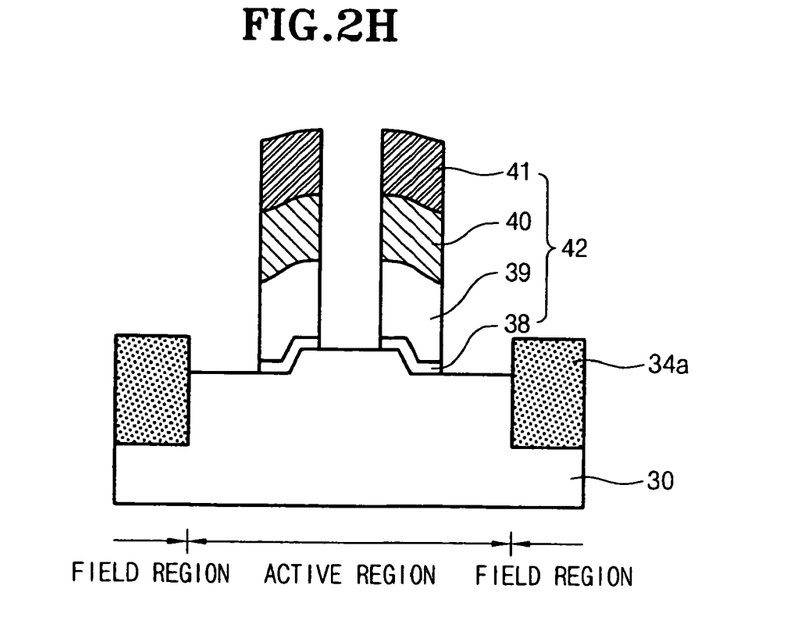

As shown in FIG. 2H, the gate hard mask film 41 is etched in a gate pattern shape. Then, the tungsten silicide film 40, the doped polycrystalline film 39 and the gate oxide film 38 are etched by using the remaining gate hard mask film 41 as an etch barrier, thereby forming the step gate 42 on each of the non-recessed portions at both edges of the central portion of the active region of the substrate 30 and the recessed portion of the active region, adjacent to each of the non-recessed portions.

Here, FIG. 2H shows that the step gate 42 consists of a sequential deposition of the doped polycrystalline silicon film 39 and the tungsten silicide film 40, but the present invention is not limited to the gate structure shown in FIG. 2H.

Meanwhile, in the above-described embodiment, the method of recessing a portion of the substrate by the processes of selectively forming and removing the metal silicide layer has been applied to both sides of the active region of the substrate as described above, i.e., portions which will be contacted with a capacitor to be formed later. However, this recessing method may also be applied in the same manner to the central portion of the active region of the substrate, i.e., a portion which will be contacted with a bit line contact region to be formed later. Also, this recessing method may be applied to both the capacitor contact region and the bit line contact region in the same manner. The application of this recessing method to these regions can provide an improvement in the refresh characteristics of the device as described above.

As can be seen from the foregoing, according to the present invention, the hard mask used in forming the isolation film is reused as a hard mask for recessing the substrate, and thus, a separate hard mask oxide film for recessing the substrate does not need to be formed. This allows a manufacturing process to be simple, resulting in a reduction in manufacturing cost. Also, due to the omission of the process of forming the hard mask oxide film, a cleaning process conducted to remove a native oxide film before the hard mask oxide film-forming process may be omitted, and thus, there is no worry that the isolation film will be attached by etchants. Accordingly, variations in the profile of the isolation film, such as an increase in moat depth and a reduction in EFH, will not occur, so that the refresh characteristics of the device will not be rapidly deteriorated.

Furthermore, according to the present invention, both sides of the active region are recessed by the processes of selectively forming and removing the metal silicide film, and thus, damage to the surface of the silicon substrate can be prevented, and the non-uniformity of the recessed depth of the substrate can be minimized. This can prevent variations in the channel profile, thus improving the refresh characteristics of the device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, the method comprising the steps of:
    forming on a silicon substrate having active and field regions a first hard mask exposing the field region;
    etching the exposed field region to form a trench;
    forming an isolation film by filling an insulating film in the trench;
    forming a second hard mask exposing both sides of the active region by etching the first hard mask;
    forming a metal film on the resulting substrate including the second hard mask;
    forming a metal silicide film on both sides of the active region by annealing the resulting substrate;
    removing the metal film unreacted in the annealing step and the metal silicide film, thereby recessing both sides of the active region;
    removing the second hard mask; and
    forming a step gate on both edges of the central portion of the active region and the recessed portion of the active region, adjacent to each of the edges.

2. The method of claim 1, wherein each of the first and second hard masks consists of an oxide film and a nitride film deposited on the oxide film.

3. The method of claim 1, wherein the trench is formed to a depth of 2,000–3,000 Å.

4. The method of claim 1, wherein the metal film is formed by a PVD or CVD process to a thickness of 100–500 Å.

5. The method of claim 1, wherein the metal film is made of any one selected from group consisting of Ti, W, Ni, Co, Ta and Mo.

6. The method of claim 1, wherein the annealing is performed at a temperature of 600–800° C. for 10–60 seconds under an atmosphere of $N_2$.

7. The method of claim 1, wherein the metal silicide film is formed to a thickness of 200–1,000 Å.

8. The method of claim 1, wherein the removal of the unreacted metal film is performed with a mixed solution of $H_2SO_4$ and $H_2O_2$ at a temperature of 100–130° C.

9. The method of claim 8, wherein the mixing ratio between $H_2SO_4$ and $H_2O_2$ in the mixed solution is 3:1 to 4:1.

10. The method of claim 1, wherein the removal of the unreacted metal film is performed with a mixed solution of $NH_4OH$, $H_2O_2$ and $H_2O$ at a temperature of ambient temperature to 40° C.

11. The method of claim 10, wherein the mixing ratio between $NH_4OH$, $H_2O_2$ and $H_2O$ in the mixed solution is 1:1:5.

12. The method of claim 1, wherein the removal of the metal silicide film is performed with a mixed solution of $H_2O$ and HF at a temperature of 4–60° C.

13. The method of claim 12, wherein the mixing ratio between $H_2O$ and HF in the mixed solution is 50:1 to 100:1.

* * * * *